(12) United States Patent
Peterson

(10) Patent No.: US 7,178,945 B2
(45) Date of Patent: Feb. 20, 2007

(54) LUMINAIRE HAVING A DEFORMABLE REFLECTOR WELL

(75) Inventor: Mark D. Peterson, Lake Oswego, OR (US)

(73) Assignee: InFocus Corporation, Wilsonville, OR (US)

( * ) Notice: Subject to any disclaimer, the term of this patent is extended or adjusted under 35 U.S.C. 154(b) by 60 days.

(21) Appl. No.: 10/945,581

(22) Filed: Sep. 20, 2004

(65) Prior Publication Data

US 2006/0062000 A1    Mar. 23, 2006

(51) Int. Cl.
*B60Q 1/14* (2006.01)
*F21V 17/02* (2006.01)
*G02B 7/188* (2006.01)

(52) U.S. Cl. .................... 362/278; 362/320; 359/847

(58) Field of Classification Search ............... 359/847; 362/278, 320
See application file for complete search history.

(56) References Cited

U.S. PATENT DOCUMENTS

| 4,046,462 | A | * | 9/1977 | Fletcher et al. .............. 359/847 |
| 4,441,791 | A |   | 4/1984 | Hornbeck |
| 4,821,053 | A | * | 4/1989 | Dowe et al. ................ 396/175 |
| 5,223,971 | A |   | 6/1993 | Magel |
| 5,752,766 | A | * | 5/1998 | Bailey et al. ............... 362/250 |
| 6,244,729 | B1 | * | 6/2001 | Waldmann .................. 362/260 |
| 6,285,400 | B1 | * | 9/2001 | Hokari ...................... 348/374 |
| 6,357,893 | B1 | * | 3/2002 | Belliveau .................... 362/285 |
| 6,561,678 | B2 | * | 5/2003 | Loughrey ................... 362/282 |
| 7,053,981 | B2 | * | 5/2006 | Bleeker ....................... 355/53 |

* cited by examiner

*Primary Examiner*—John Anthony Ward
*Assistant Examiner*—David Makiya
(74) *Attorney, Agent, or Firm*—Schwabe Williamson & Wyatt

(57) ABSTRACT

An apparatus, system, and method for a luminaire with a light emitting device and a deformable reflector well is disclosed herein.

15 Claims, 3 Drawing Sheets

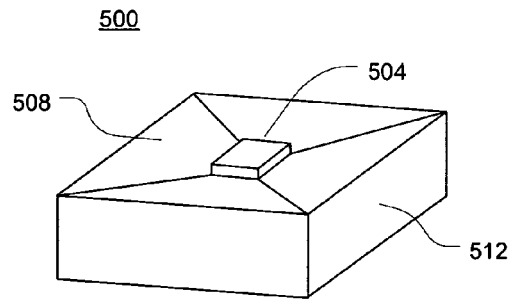
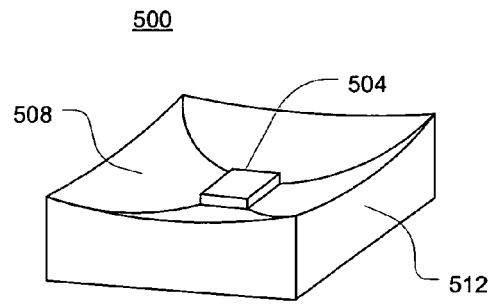
Fig. 5a  Fig. 5b
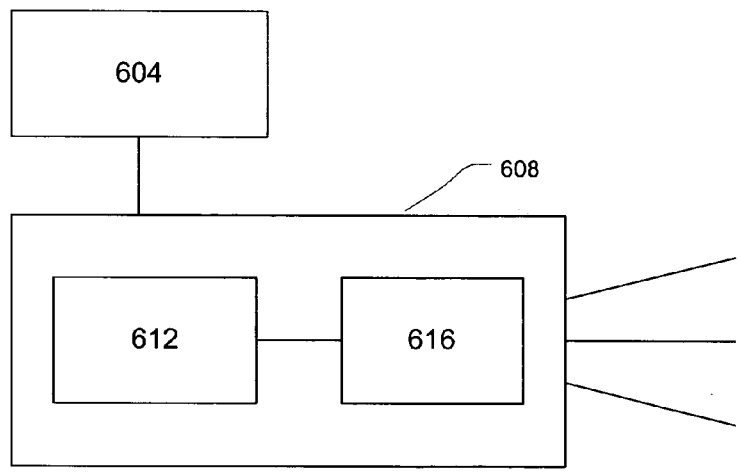
Fig. 6

LUMINAIRE HAVING A DEFORMABLE REFLECTOR WELL

FIELD OF THE INVENTION

Disclosed embodiments of the present invention relate to the field of luminaires, and more particularly to a luminaire with a deformable reflector well.

BACKGROUND OF THE INVENTION

A luminaire is a lighting unit that produces and distributes light. Traditionally, a luminaire contains a light emitting device to produce light, and a reflecting well to collect and distribute the light. Prior art reflector wells are typically constructed of a reflective material molded into one of a limited number of generic designs, usually spherical, each with its own associated reflection attributes. Once the light emitting device and the reflector well are fixed relative to one another the collection and distribution properties of the luminaire are largely constrained. However, many applications may benefit from the ability to adjust these properties to address changing conditions.

BRIEF DESCRIPTION OF THE DRAWINGS

Embodiments of the invention are illustrated by way of example and not by way of limitation in the figures of the accompanying drawings, in which like references indicate similar elements and in which:

FIGS. 5a–5b illustrate perspective views of an luminaire in varying stages of actuation, in accordance with an embodiment of the present invention; and FIG. 6 illustrates a system having an illumination module in accordance with an embodiment of the present invention.

DETAILED DESCRIPTION OF THE ILLUSTRATIVE EMBODIMENTS

Illustrative embodiments of the present invention include but are not limited to a luminaire with a light emitting device and a deformable reflector well, and methods practiced thereon.

Various aspects of the illustrative embodiments will be described using terms commonly employed by those skilled in the art to convey the substance of their work to others skilled in the art. However, it will be apparent to those skilled in the art that alternate embodiments may be practiced with only some of the described aspects. For purposes of explanation specific materials and configurations are set forth in order to provide a thorough understanding of the illustrative embodiments. However, it will be apparent to one skilled in the art that alternate embodiments may be practiced without the specific details. In other instances, well-known features are omitted or simplified in order not to obscure the illustrative embodiments.

Further, various operations will be described as multiple discrete operations, in turn, in a manner that is most helpful in understanding the present invention; however, the order of description should not be construed as to imply that these operations are necessarily order dependent. In particular, these operations need not be performed in the order of presentation.

The phrase "in one embodiment" is used repeatedly. The phrase generally does not refer to the same embodiment; however, it may. The terms "comprising", "having", and "including" are synonymous, unless the context dictates otherwise.

Figure 1A:
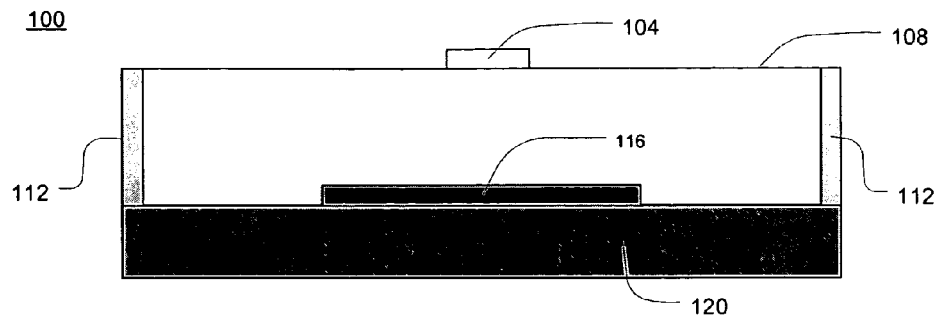
FIGS. 1a–1b illustrate a luminaire with a deformable reflector well, in accordance with an embodiment of the present invention.
Figure 1B:
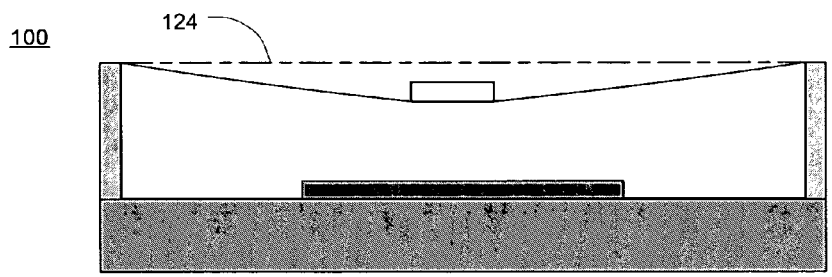

FIGS. 1a–1b illustrate two states of a luminaire 100 in accordance with an embodiment of the present invention. More particularly, FIG. 1a illustrates a luminaire 100, which may also be referred to as a lighting unit, having a light emitting device 104 coupled to a deformable membrane 108 in a neutral position. The deformable membrane 108 may be coupled to supports 112 such that the light emitting device 104 is held a distance away from an actuator 116. A substrate 120 may be coupled to the light emitting device 104, the deformable membrane 108, and the actuator 116 to provide support and/or electrical connections to each of the components.

In one embodiment the light emitting device 104 may include a solid state light emitting device such as, but not limited to, a light emitting diode or a laser diode. However, other light sources may be used as appropriate for specific constraints and design criteria of particular embodiments.

In one embodiment, electrical connections providing, e.g., power and/or control signals may be coupled to the light emitting device 104 from the substrate 120 through traces in the supports 112 and the reflective membrane 108. In another embodiment, electrical connections may be provided through a flexible substrate (not shown) coupling the light emitting device 104 to the substrate 120.

FIG. 1b illustrates the actuator 116 being actuated such that a deflecting force is exerted on the deformable membrane 108, in accordance with an embodiment of the present invention. In the actuated state the deformable membrane 108 may be deformed, or deflected, from a neutral axis 124. The inward deflection of the membrane 108, and the light emitting device 104 coupled thereto, may provide a reflector well for the light emitting device 104. This reflector well may be used to collect light emitted from the light emitting device 104 and to distribute it in a controlled pattern. The deformable reflector well may provide the primary distribution characteristics of the illumination emitted by the light emitting device 104 including, e.g., focal distance and direction. The desired distribution characteristics may be determined with reference to the objectives of a specific embodiment.

In one embodiment, the deformable membrane 108 may be made of a flexible material with a desired reflection characteristic, or having a reflective coating applied to the surface adjacent to the light emitting device 104. In various embodiments the reflective material/coating may include metals such as, but not limited to, Aluminum (Al), Gold (Au), Copper (Cu), Nickel (Ni), Molybdenum (Mo), and Rhodium (Rh).

While embodiments of the present invention are discussed with the actuated state deflecting the membrane 108 away from the neutral axis 124, other embodiments may employ a converse arrangement. Additionally, in still other embodiments an actuated state may simply change the shape of an existing reflector well, without having the membrane 108 being on the neutral axis in either the actuated state or the non-actuated state.

As shown in FIGS. 1a–1b, the light emitting device 104 is coupled to the membrane 108 and is deflected from the neutral axis 124 along with the membrane 108. In other embodiments, the light emitting device 104 may be decoupled from the membrane 108 so that the membrane 108 may deflect without moving the light emitting device 104. In these embodiments, the light emitting device 104 may be oriented to emit light towards the reflective membrane 108. In one embodiment, the light emitting device 104 may be positioned on (or near) the neutral axis 124 by a suspension support coupled to the supports 112. In another embodiment, the light emitting device 104 may be positioned on (or near) the neutral axis by a column support coupled to the substrate 120, through an opening in the membrane 108.

In one embodiment, the actuator 116 may cause mechanical deflection of the membrane 108 by facilitating the existence of an electromagnetic field. For example, the actuator 116 may be an electrode to which voltage is applied to create the electromagnetic field. The membrane 108 in this embodiment may be conductive such that it acts as a complementary electrode that is affected by the electromagnetic field. In another embodiment, the membrane 108 may include one or more conductive electrode anchors embedded in, or attached to, a non-conductive deformable material. The anchors in this embodiment may be affected by the electromagnetic field and cause the desired deflection of the membrane 108. Strategic design and placement of the anchors may allow for a wide variety of contoured shapes for the resultant reflector well.

In another embodiment the actuator 116 may be a piezoelectric actuator and the membrane 108 may be a piezoelectric polymer film. In one embodiment, a piezoelectric actuator may be used as an acoustooptic modulator to vibrate the membrane 108 to give the light reflected off it a desired Doppler shift. This may be useful for fine-tuning the light emitting device 104 frequency in, for example, signaling applications.

As shown, the actuator 116 exerts an attractive force upon the membrane 108. In other embodiments, the actuator 116 may exert a repulsive force on the periphery of the membrane 108 in order to form the reflector well. In this embodiment, the membrane 108 may be coupled to the supports 112 in a manner to allow movement up and down the supports 112.

In one embodiment, the light emitting device 104 may be a light source that is capable of emitting light in more than one direction. However, in one embodiment the light emitting device 104 may be designed to only emit light towards the reflective membrane 108. This may facilitate the control of the distribution characteristics of the reflected illumination, as the light emitted away from the reflective membrane 108 may be a diverging light beam.

While the above embodiment discusses two actuation states (on/off), other embodiments may include a wide range of actuation states resulting in varying degrees of deflection.

Figure 2A:
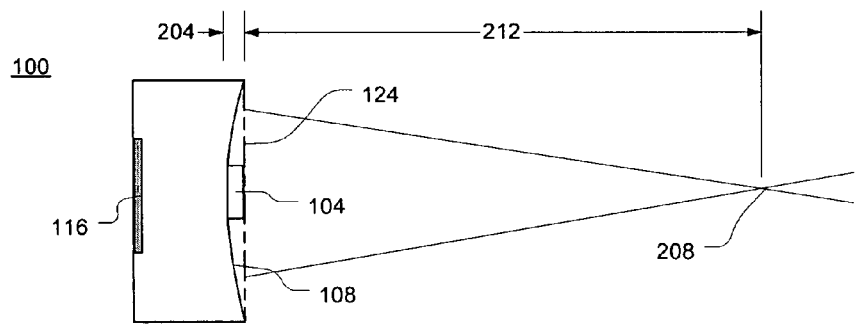
FIGS. 2a–2b illustrate a luminaire with a deformable reflector well exhibiting varying focal distances, in accordance with an embodiment of the present invention.
Figure 2B:
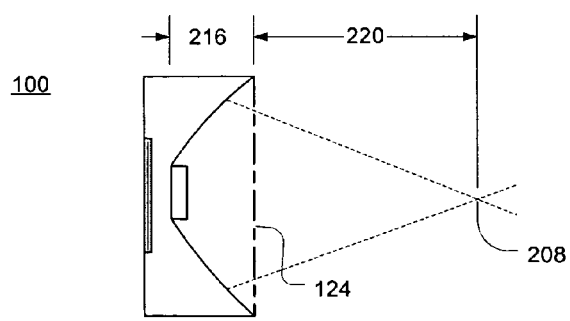

FIGS. 2a–2b illustrate the luminaire 100 having different focal distances due to the deflected distance of the membrane 108, in accordance with one embodiment of the present invention. FIG. 2a illustrates the actuator 116 causing the membrane 108 to deflect a distance 204 from the neutral axis 124. The resulting reflector well created by such a deflection may have a focal point 208 at a focal distance 212.

FIG. 2b illustrates the actuator 116 causing a force to be exerted on the membrane 108 that results in a deflection distance 216, which is greater than the deflection distance 204. In this embodiment, the resulting focal distance 220 may be less than the focal distance 212. In various embodiments, the force acting upon the membrane 108 may be varied by adjusting parameters of the luminaire 100 including but not limited to voltage applied to the actuator 116, the area of the actuator 116, the distance between the actuator 116 and the membrane 108, and the presence and location of any additional actuators.

Figure 3:
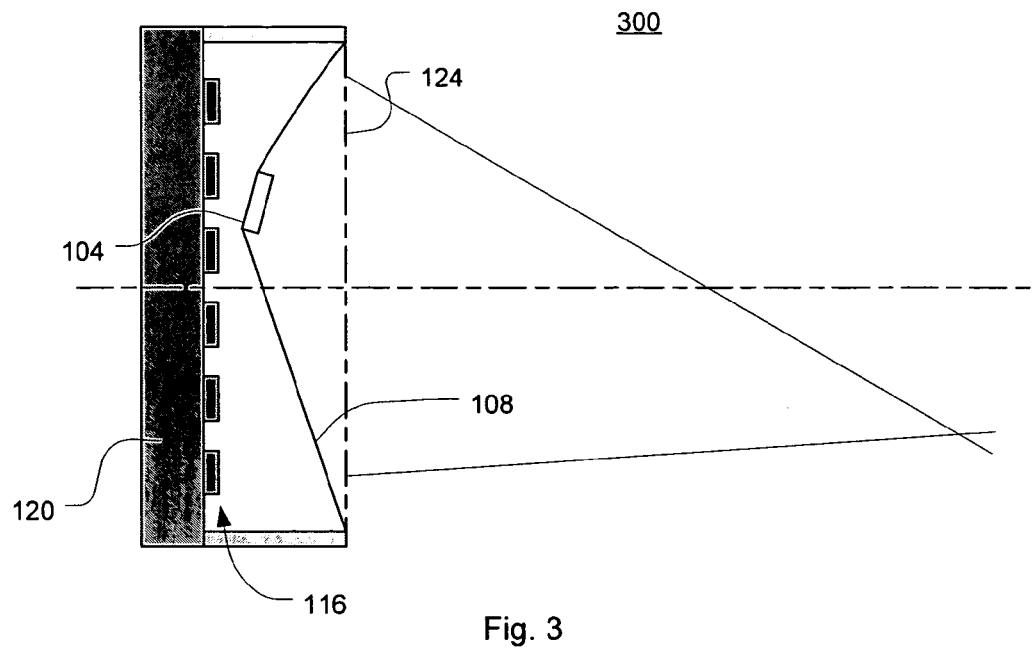
FIG. 3 illustrates a luminaire with a deformable reflector well having an off-axis focal point, in accordance with an embodiment of the present invention.

FIG. 3 illustrates a luminaire 300 with a plurality of actuators 116, in accordance with an embodiment of the present invention. The actuators 116 may be selectably actuated in order to contour the membrane 108 into a predetermined reflector well configuration. The predetermined reflector well configuration may produce a reflected illumination bundle having desired distribution properties. For example, in one embodiment the actuators 116 may be actuated in such a manner as to produce a collimating reflector well resulting in the reflection of a substantially collimated illumination bundle. In various embodiments, the actuators 116 may be capable of producing a wide variety of shapes for the reflector well, resulting in the reflected illumination exhibiting a wide variety of distribution properties.

As in the illustrated embodiment, a predetermined reflector well configuration may direct light along an axis that is non-orthogonal to the neutral axis 124. This may be particularly useful when a luminaire does not lie on the same optical axis as other luminaires within the same array, for example. As additionally shown in the illustrated embodiment, selective actuation of the actuators 116 could pull the light emitting device 104 off-center to facilitate the directing of the light. In this embodiment, conductive anchors may be located on or around the center of the reflective membrane 108. The portion of the membrane 108 opposite the direction of the deflection (in the illustrated embodiment this would be below the light emitting device 104) may be in tension while the portion of the membrane 108 towards the deflection may be in compression (or at least at less tension than the lower portion).

Figure 4:
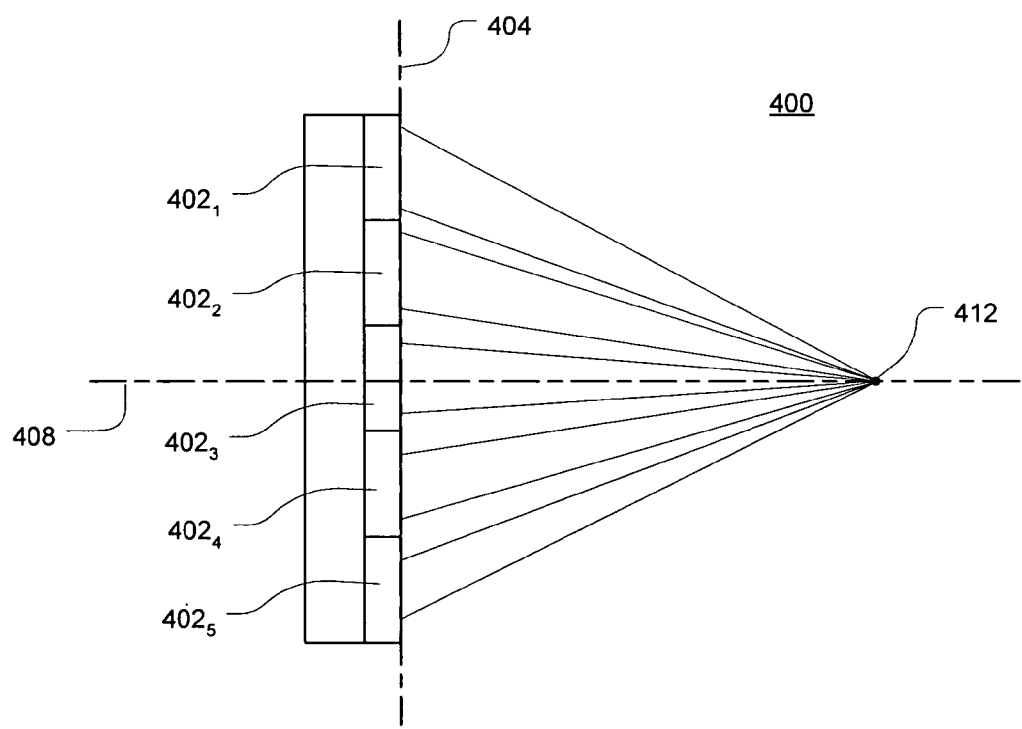
FIG. 4 illustrates an illumination module including an array of luminaires with deformable reflector wells, in accordance with an embodiment of the present invention.

FIG. 4 illustrates an illumination module 400 in accordance with an embodiment of the present invention. In this embodiment, the illumination module 400 may include an array of luminaires $402_{1-5}$ that may be aligned along a common neutral axis 404. The illumination module 400 may have a primary optical path 408, along which only the luminaire $402_3$ is aligned. In order for light from each of the luminaires 402 to converge with a common focal point 412, the off-line luminaires $402_{1, 2, 4, and 5}$ must each have an angled optical axis and focal distances that may vary from at least some of the other luminaires. This may be done by applying an actuation pattern based at least in part on the location of the particular luminaire. This may facilitate a planar array of luminaires being adaptable to a wide variety of applications.

In one embodiment, the actuation patterns could be switched in such a manner that light from all of the luminaires 402 alternates between converging at the focal point 412 to being substantially collimated.

FIGS. 5a–5b illustrate a perspective view of two states of a luminaire 500 that may be particularly useful in an array formation, in accordance with an embodiment of the present invention. FIG. 5a illustrates a membrane 508 supported along a neutral axis by supports 512. FIG. 5b illustrates the membrane 508 deflected into reflector well for the light emitting device 504. The components of this embodiment may be similar to the embodiments discussed above; however, the perimeter geometry of the illumination module 500 is polygonal, and more particularly a square. This may be used in an embodiment having an array of luminaires, similar to the one discussed with reference to FIG. 4, whereas a reflector well with a circular perimeter geometry would have dark spots adjacent to the luminaires where the reflector wells did not meet.

FIG. 6 is a simplified pictorial plan view of a system including a video unit 604 coupled to a projection device 608, in accordance with an embodiment of the present invention. In this embodiment the video unit 604 may transmit video signals to the projection device 608, which may include an illumination module 612 optically coupled to image projection optics 616. The components of the projection device 608 may cooperate with one another to jointly effectuate rendering of desired images, which may be image frames of a video, based on the transmitted video signals.

In one embodiment the illumination module 612 may provide an illumination bundle to the image projection optics 616. The illumination module 612 may include one or more luminaires, similar to luminaires discussed with reference to earlier embodiments. The image projection optics 616 may modulate the illumination bundle to form image-bearing light with an image-forming device, and project an image through a projection lens. The image projection optics 616 may include a digitally driven light valve such as, but not limited to, a liquid crystal display, a liquid crystal on silicon device, or a digital micromirror device.

The video unit 604 may include a personal or laptop computer, DVD, set-top box (STB), video camera, video recorder, an integrated television tuner, or any other suitable device to transmit video signals to the projection device 608. In various embodiments, the system may be, for example, a projector or a projection television.

In various embodiments, luminaires described in the above-illustrated embodiments may be used in a wide variety of applications other than projections systems. For example, luminaires with adaptable distribution characteristics may be employed in applications such as, but not limited to, optical transmitters, headlights, flashlights, advertising displays, traffic signals, security equipment, etc.

Although specific embodiments have been illustrated and described herein for purposes of description of the preferred embodiment, it will be appreciated by those of ordinary skill in the art that a wide variety of alternate and/or equivalent implementations calculated to achieve the same purposes may be substituted for the specific embodiment shown and described without departing from the scope of the present invention. Those with skill in the art will readily appreciate that the present invention may be implemented in a very wide variety of embodiments. This application is intended to cover any adaptations or variations of the embodiments discussed herein. Therefore, it is manifestly intended that this invention be limited only by the claims and the equivalents thereof.

What is claimed is:

1. A luminaire comprising:
   a solid-state light emitting device;
   a deformable membrane adjacent to the solid-state light emitting device, having a reflective surface; and
   an electromagnetic actuator adapted to deflect the deformable membrane by exerting an electromagnetic force directly on the deformable membrane to provide a first predetermined reflector well configuration for the solid-state light emitting device.

2. The luminaire of claim 1, further comprising:
   a substrate coupled to the solid-state light emitting device and adapted to provide electrical connections to the solid-state light emitting device.

3. The luminaire of claim 1, wherein the deformable membrane is coupled to the solid-state light emitting device.

4. The luminaire of claim 3, wherein the deformable membrane is coupled to the substrate and adapted to provide electrical connections between the solid-state light emitting device and the substrate.

5. The luminaire of claim 1, wherein the deformable membrane is constructed of a material adapted to respond to an electromagnetic force exerted by the electromagnetic actuator.

6. The luminaire of claim 1, wherein the deformable membrane includes a plurality of anchors adapted to respond to an electromagnetic force exerted by the electromagnetic actuator.

7. The luminaire of claim 1, wherein the deformable membrane has a polygonal perimeter geometry.

8. A method comprising:
   operating a solid-state light emitting device to output light; and
   actuating a first electromagnetic actuator to exert an electromagnetic force directly on a reflective membrane, adjacent to the light emitting device, to deflect the reflective membrane into a predetermined reflector well configuration.

9. The method of claim 8, further comprising:
   vibrating the reflective membrane.

10. The method of claim 8, further comprising:
    actuating one or more additional electromagnetic actuators to cooperate with the first electromagnetic actuator in deflecting the reflective membrane into the predetermined reflector well configuration.

11. A system comprising:
    an illumination module having a luminaire including
       a solid-state light emitting device;
       a deformable membrane, adjacent to the solid-state light emitting device, having a reflective surface; and
       an electromagnetic actuator adapted to deflect the deformable membrane by exerting an electromagnetic force directly on the deformable membrane to provide a predetermined reflector well configuration for the light emitting device; and
    a substrate coupled to the illumination module and adapted to provide electrical connections to the illumination module.

12. The system of claim 11, wherein the luminaire further includes
    one or more additional actuators adapted to cooperate with the electromagnetic actuator to deflect the deformable membrane to provide the predetermined reflector well configuration.

13. The system of claim 11, wherein the luminaire is a first luminaire and the illumination module further comprises a plurality of luminaires, including the first luminaire, coupled to the substrate.

14. The system of claim 11, further comprising:
    a video unit with an output video signal; and
    a projection device, having the illumination module, coupled to the video unit, to receive video signal and project video.

15. The system of claim 14, in which the video unit is selected from a group consisting of a digital versatile disk (DVD), a video camera, an integrated television tuner, and a set-top box.

* * * * *